(12) United States Patent
Kang

(10) Patent No.: US 8,536,580 B2
(45) Date of Patent: Sep. 17, 2013

(54) ORGANIC LIGHT-EMITTING DISPLAY DEVICE

(75) Inventor: Seong-Jong Kang, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/355,857

(22) Filed: Jan. 23, 2012

(65) Prior Publication Data

US 2013/0009162 A1   Jan. 10, 2013

(30) Foreign Application Priority Data

Jul. 7, 2011 (KR) .................. 10-2011-0067534

(51) Int. Cl.
*H01L 29/04* (2006.01)

(52) U.S. Cl.
USPC .......... 257/72; 257/59; 257/88; 257/E51.005; 257/E51.018

(58) Field of Classification Search
USPC ................. 257/59, 72, 88, E51.005, E51.018
See application file for complete search history.

(56) References Cited

U.S. PATENT DOCUMENTS

| 7,701,132 B2 | 4/2010 | Oh |
| 7,728,510 B2 | 6/2010 | Oh |
| 2007/0132365 A1* | 6/2007 | Kang et al. .................. 313/500 |
| 2010/0320909 A1 | 12/2010 | Izumi |

FOREIGN PATENT DOCUMENTS

| JP | 2011-8969 | 1/2011 |
| KR | 10-2006-0059722 | 6/2006 |
| KR | 10-2006-0067049 | 6/2006 |

* cited by examiner

*Primary Examiner* — Andy Huynh
(74) *Attorney, Agent, or Firm* — Lee & Morse, P.C.

(57) ABSTRACT

An organic light-emitting display device may include a substrate; a plurality of thin film transistors (TFTs) on the substrate; a plurality of first electrodes respectively on the TFTs; a pixel-defining layer between the first electrodes, the pixel-defining layer including a covered portion and an uncovered portion; a plurality of organic layers respectively on the first electrodes, each organic layer including an emission layer; a second electrode covering at least a part of the organic layers and the pixel-defining layer, a portion of the pixel-defining layer covered by the second electrode defining the covered portion, wherein at least one outgassing hole is in the uncovered portion of the pixel-defining layer, the uncovered portion being an exposed area of the pixel-defining layer.

15 Claims, 4 Drawing Sheets

ORGANIC LIGHT-EMITTING DISPLAY DEVICE

CROSS-REFERENCE TO RELATED PATENT APPLICATION

This application claims the benefit of Korean Patent Application No. 10-2011-0067534, filed on Jul. 7, 2011, in the Korean Intellectual Property Office, the disclosure of which is incorporated herein in its entirety by reference.

BACKGROUND

1. Field

Embodiments relate to an organic light-emitting display device.

2. Description of the Related Art

In general, flat display devices may be classified into an emissive type and a non-emissive type. The emissive type display devices may include, for example, flat cathode ray tubes, plasma display panels (PDPs), and electroluminescent devices. The non-emissive type display devices may include liquid crystal displays (LCDs). The electroluminescent devices have wide viewing angles, excellent contrasts, and rapid response speeds and thus have recently been highlighted as next generation display devices. Such electroluminescent devices may be divided into inorganic electroluminescent devices and organic electroluminescent devices according to materials for forming an emission layer.

An organic electroluminescent device is a self-luminous display that electrically excites fluorescent organic compounds and emits light and has been highlighted as a next generation display device which may be driven at low voltage, easily made thin, has a wide viewing angle, and a rapid response speed.

The organic electroluminescent device includes an emission layer that is formed of an organic material and is interposed between an anode and a cathode. As an anode voltage and a cathode voltage are respectively applied to the anode and the cathode, holes injected from the anode move to the emission layer through a hole transport layer (HTL) and electrons move from the cathode to the emission layer through an electron transport layer (ETL) so that the holes and the electrons recombine in the emission layer to form excitons.

The excitons change from an excited state to a ground state so that fluorescent molecules of the emission layer radiate, thereby forming an image. In a full-color type organic electroluminescent device, pixels that emit red R, green G, and blue B color are included to realize a full color.

In such an organic electroluminescent device, pixel-defining layers are respectively formed at both end portions of an anode. Then, after a predetermined opening is formed in the pixel-defining layer, an emission layer and a cathode are sequentially formed on the anode that is exposed to the outside by the opening.

SUMMARY

One or more embodiments may provide an organic light-emitting display device including: a substrate; a plurality of thin film transistors (TFTs) on the substrate; a plurality of first electrodes respectively on the TFTs; a pixel-defining layer between the first electrodes, the pixel-defining layer including a covered portion and an uncovered portion; a plurality of organic layers respectively on the first electrodes, each organic layer including an emission layer; a second electrode covering at least a part of the organic layers and the pixel-defining layer, a portion of the pixel-defining layer covered by the second electrode defining the covered portion, wherein at least one outgassing hole is in the uncovered portion of the pixel-defining layer, the uncovered portion being an exposed area of the pixel-defining layer. A plurality of outgassing holes may be in the uncovered portion of the pixel-defining layer.

The covered portion covered by the second electrode may be different from the uncovered portion in which the at least one outgassing hole is defined.

The organic light-emitting display device may further include a planarization layer between the TFTs and the pixel-defining layer, the planarization layer covering the TFTs, wherein the at least one outgassing hole exposes at least a part of the planarization layer.

The covered portion of the pixel-defining layer and the uncovered portion of the pixel-defining layer may consist of different portions of the pixel-defining layer.

One or more embodiments may provide an organic light-emitting display device including: at least one thin film transistor (TFT) on a substrate, the TFT including an active layer, a gate electrode insulated from the active layer, and source and drain electrodes contacting opposing sides of a semiconductor active layer; a planarization layer on the at least one TFT and covering the at least one TFT; at least one first electrode on the planarization layer and electrically connected to the at least one TFT; at least one organic layer formed on the at least one first electrode, the at least one organic layer including an emission layer; a second electrode facing the at least one first electrode; and a pixel-defining layer covering an edge portion of the at least one first electrode; wherein an outgassing hole is in an edge area of the pixel-defining layer and exposes at least a part of the planarization layer.

The outgassing hole may be in the pixel-defining layer in an area where the second electrode is not formed.

The outgassing hole may be formed in an upper portion of the pixel-defining layer.

The second electrode may be on a portion of the pixel-defining layer that is different from a portion of the pixel-defining layer in which the outgassing hole is defined.

The organic light-emitting display device may further include a common power supply line including a material that is the same as a material included in the gate electrode and may be on a same plane as the gate electrode.

The organic light-emitting display device may further include a common power supply line, the common power supply line may include a material that is the same as a material included in the source and drain electrodes on the substrate.

Ends of the second electrode may be spaced from an edge of the pixel-defining layer.

One or more embodiments may provide an organic light-emitting display device including: a substrate; a display area including a plurality of TFTs on the substrate, a plurality of first electrodes electrically connected to the TFTS, and a plurality of organic layers respectively on the first electrodes, each of the plurality of organic layers including an emission layer; a cathode area that includes the display area and a second electrode facing the first electrode; and a pixel-defining layer area including the cathode area, the pixel-defining layer covering at least a part of the first electrode and including at least one outgassing hole, the at least one outgassing hole in an area of the pixel-defining layer that is outside the cathode area.

The at least one outgassing hole may be in a portion of the pixel-defining layer that is different from a portion of the pixel-defining layer covered by the second electrode.

The area of the pixel-defining layer including the cathode area may be different from the area of the pixel-defining layer including the at least one outgassing hole.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Embodiments will now be described more fully with reference to the accompanying drawings, in which exemplary embodiments are shown. The embodiments may, however, be embodied in many different forms.

Figure 1:
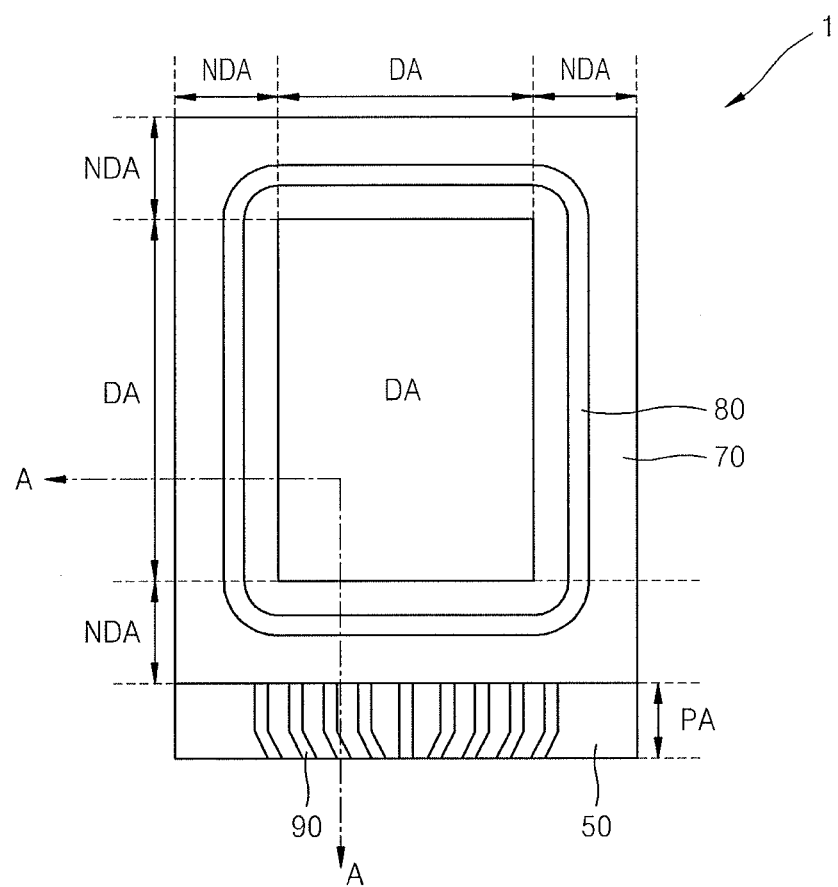
FIG. 1 illustrates a schematic plan view of a structure of an organic light-emitting display device, according to an embodiment.

FIG. 1 illustrates a schematic plan view of a structure of an organic light-emitting display device 1, according to an embodiment.

The organic light-emitting display device 1 may include a first substrate 50, including a thin film transistor (TFT) and an emission pixel, and a second substrate 70 coupled with the first substrate 50 through sealing.

The TFT, an organic light-emitting device (EL), a storage capacitor Cst, etc. may be formed in the first substrate 50. The first substrate 50 may be a crystalline silicon (LTPS) substrate, a glass substrate, a plastic substrate, a stainless steel (SUS) substrate, or the like.

The second substrate 70 may be a sealing substrate disposed on the first substrate 50 so as to prevent moisture or air from penetrating the TFT or the organic light-emitting device, which are formed in the first substrate 50. The second substrate 70 may be disposed opposite the first substrate 50, and the first substrate 50 and the second substrate 70 may be coupled to each other using a sealing member 80 disposed along side edges of the second substrate 70. The second substrate 70 may be a transparent glass substrate or plastic substrate.

The first substrate 50 may include a display area DA where light exits and a non-display area NDA located outside of the display area DA. According to embodiments, the sealing member 80 may be disposed in the non-display area NDA outside the display area so as to couple the first substrate 50 and the second substrate 70.

As described above, an organic light-emitting device (EL), a TFT for driving the organic light-emitting device, and wiring that is electrically connected to the organic light-emitting device and the TFT may be formed in the display area DA. The non-display area NDA may include a pad area PA where a pad electrode extending from the wiring of the display area DA is located.

Figure 2:
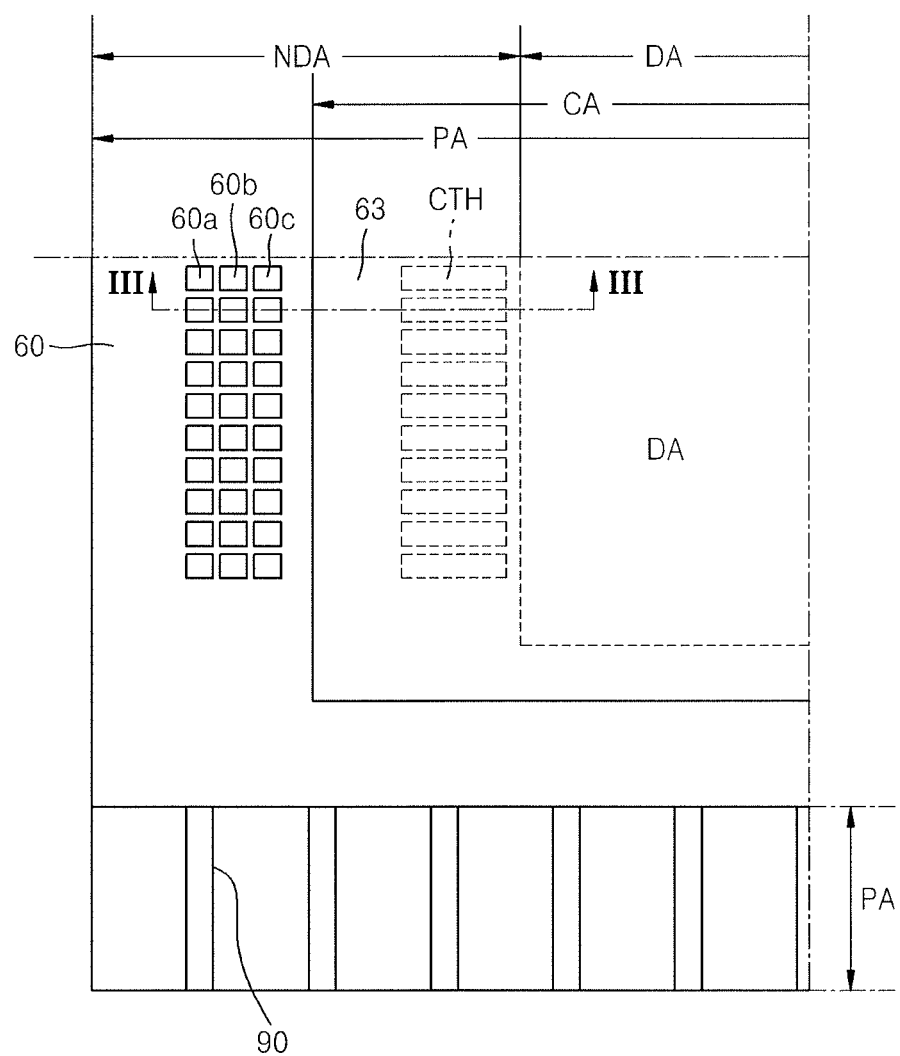
FIG. 2 illustrates an enlarged view of a part A-A of the organic light-emitting display device illustrated in FIG. 1.
Figure 3:
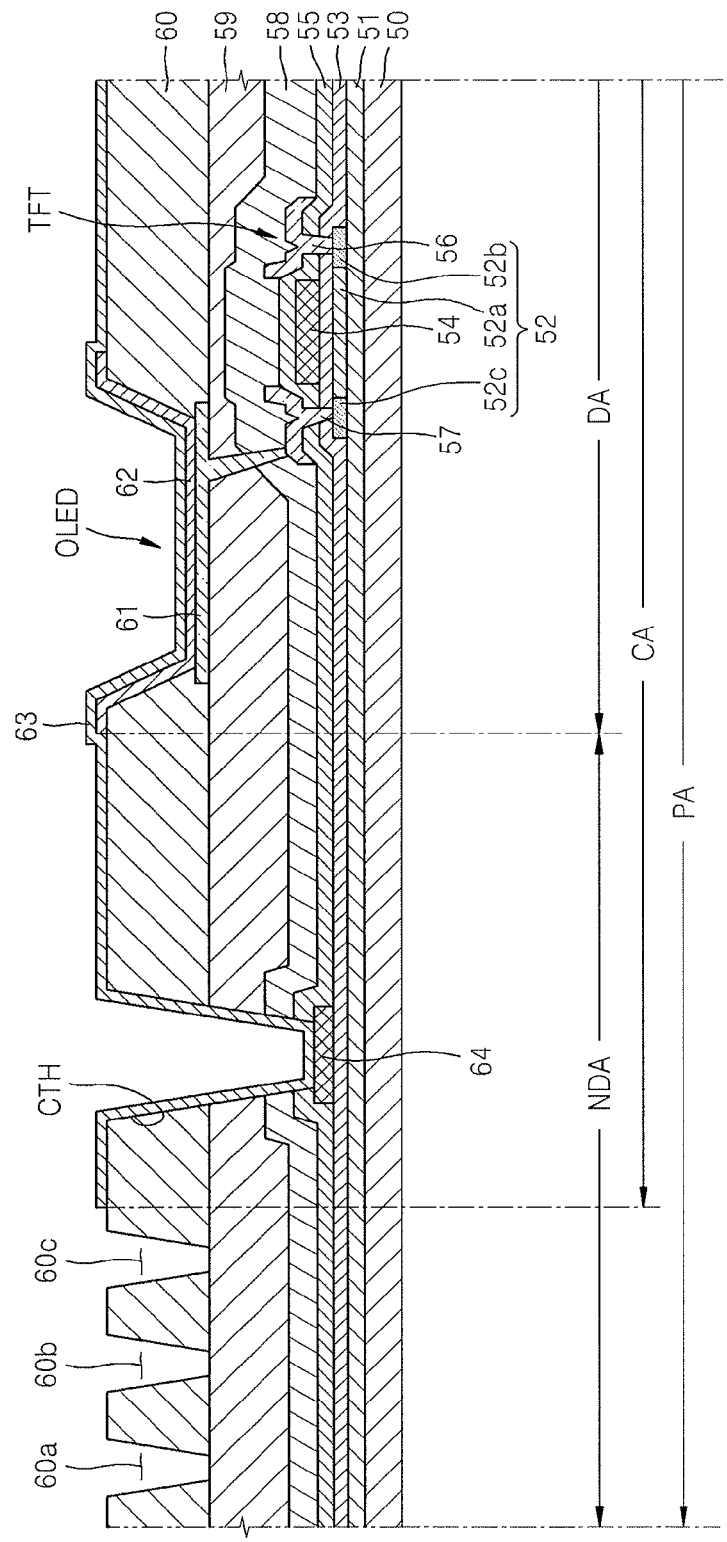
FIG. 3 illustrates a cross-sectional view taken along a line III-III of the organic light-emitting display device illustrated in FIG. 2.

FIG. 2 illustrates an enlarged view of a part A-A of the organic light-emitting display device illustrated in FIG. 1. FIG. 3 illustrates a cross-sectional view taken along a line III-III of the organic light-emitting display device illustrated in FIG. 2.

As may be seen in FIGS. 2 and 3, in the organic light-emitting display device 1 according to the current embodiment, outgassing holes 60a, 60b, and 60c may be formed in an area where a second electrode 63 is not formed in the non-display area NDA, so that a pixel shrinkage phenomenon due to deterioration of an organic emission layer may be prevented from occurring due to an outgassing phenomenon in an organic layer, which will be described later in detail.

As illustrated in FIGS. 2 and 3, a buffer layer 51 may be formed on the first substrate 50. The first substrate 50 may be formed of a glass material or a plastic material. A TFT and an organic electroluminescent device (OLED) may be formed on the buffer layer 51.

The buffer layer 51 may be formed on the first substrate 50. An active layer 52 may be formed of a semiconductor material and may be formed on the buffer layer 51. A gate insulating layer 53 may cover the active layer 52. A gate electrode 54 is formed on the gate insulating layer 53. The gate electrode 54 may be connected to a gate line (not shown) for applying an ON/OFF signal to the TFT. An insulating interlayer 55 may cover the gate electrode 54, and source/drain electrodes 56 and 57 may be formed on the insulating interlayer 55. The source/drain electrodes 56 and 57, respectively, may contact source/drain regions $52b$ and $52c$ of the active layer 52 via contact holes formed in the gate insulating layer 53 and the insulating interlayer 55. A passivation layer 58 may be formed of $SiO_2$ or SiNx and may be formed on the source/drain electrodes 56 and 57. A planarization layer 59 may be formed of an organic material, such as acryl, polyimide, benzocyclobutene (BCB), and so forth, and may be formed on the passivation layer 58.

In detail, the active layer 52, formed above the first substrate 50, may be selectively formed of an inorganic semiconductor or an organic semiconductor. The active layer 52 may include source/drain regions $52b$ and $52c$, doped with an n-type or p-type impurity material, and a channel region $52a$, connecting the source region $52b$ and the drain region $52c$.

The inorganic semiconductor for forming the active layer 52 may include CdS, GaS, ZnS, CdSe, CaSe, ZnSe, CdTe, SiC, Si, and so forth. The organic semiconductor for forming the active layer 52 may include polythiophene and derivatives thereof, poly(p-phenylene vinylene) (PPV) and derivatives thereof, poly(p-phenylene) and derivatives thereof, polyfluoren and derivatives thereof, polythiovinylene and derivatives thereof, and polythiophene-heterocyclic copolymer and derivatives thereof, as a high molecular weight material. The organic semiconductor for forming the active layer 52 may include pentacene, tetracene, oligoacene of naphthalene and derivatives thereof, α-6-thiophene, oligothiophene of α-5-thiophene and derivatives thereof, phtalocyanine with or without metal and derivatives thereof, pyromellitic dianhydride or pyromellitic diimide and derivatives thereof, perylenetetracarboxylic acid dianhydride or perylenecarboxylic diimide and derivatives thereof, as a low molecular weight material.

The active layer 52 may be covered by the gate insulating layer 53, and the gate electrode 54 may be formed on the gate insulating layer 53. The gate electrode 54 may be formed of a conductive metal layer including, e.g., MoW, Al, Cr, Al/Cu or a combination thereof. The gate electrode 54 may cover a region corresponding to the channel region 52*a* of the active layer 52.

The passivation layer 58, which may protect the TFT, may be formed of $SiO_2$ or SiNx, and may be formed on the TFT. The planarization layer 59, which may planarize an upper surface of the passivation layer 58 and may be formed of an organic material, such as, acryl, polyimide, BCB, and so forth, may be formed on the passivation layer 58. In FIG. 3, the passivation layer 58 and the planarization layer 59 are separately formed. Alternatively, the passivation layer 58 and the planarization layer 59 may be formed as one layer so that the passivation layer 58 and the planarization layer 59 may function as a passivation layer for protecting the TFT or a planarization layer for planarizing an upper surface thereof.

A predetermined opening may be formed in the passivation layer 58 and the planarization layer 59. A first electrode 61, which may be an anode of the OLED, may be formed on the passivation layer 58 and the planarization layer 59. A pixel-defining layer 60, formed of an organic material, may cover the first electrode 61. After a predetermined opening is formed in the pixel-defining layer 60, an organic layer 62 may be formed on the pixel-defining layer 60 and on the first electrode 61 that is externally exposed. In this regard, the organic layer 62 may include an emission layer. However, the embodiments are not limited to the materials specifically described herein, and any of various structures of the organic light-emitting display device may be used.

The pixel-defining layer 60 may be formed of polyimide (PI), polyamide (PA), an acrylic resin, an organic-based BCB, a phenol resin, and so forth, as an organic-based material.

In the organic light-emitting display device according to the current embodiment, one or more outgassing holes may be formed in the pixel-defining layer 60 in an area where the second electrode 63 is not formed, which will be described later in detail.

The OLED may emit red, green, and blue light according to a flow of current and may displays information of a predetermined image. The OLED may include the first electrode 61 connected to the drain electrode 56 of the TFT and that receives positive power from the drain electrode 56, the second electrode 63 covering the entire pixel and receiving negative power, and the organic layer 62 between the first electrode 61 and the second electrode 63 and emits light.

The first electrode 61 and the second electrode 63 may be insulated from each other by the organic layer 62, and may apply voltages of opposite polarities to the organic layer 62 so as to allow the organic layer 62 to emit light.

The organic layer 62 may be a low-molecular weight organic layer or a high-molecular weight organic layer. When the organic layer 62 is a low-molecular weight organic layer, a hole injection layer (HIL), a hole transport layer (HTL), an emission layer (EML), an electron transport layer (ETL), and an electron injection layer (EIL) may be stacked to form a single structure or a compound structure. Examples of available organic materials may include, for example, copper phthalocyanine (CuPc), N,N'-di(naphthalene-1-yl)-N,N'-diphenyl-benzidine (NPB), tris-8-hydroxyquinoline aluminum ($Alq_3$), and the like. The low-molecular weight organic layer may be formed by vacuum evaporation.

When the organic layer 62 is a high-molecular weight organic layer, the organic layer 62 may include an HTL and an EML. In this regard, the HTL may be formed of, for example, polyethylenedioxythiophene (PEDOT), and the EML may be formed of, for example, a PPV-based high-molecular weight organic material or a polyfluorene-based high-molecular weight organic material. The high-molecular weight organic layer may be formed by printing or inkjet printing. However, the embodiments are not limited to the materials specifically described herein.

The first electrode 61 may function as an anode and the second electrode 63 may function as a cathode. Alternatively, the polarities of the first electrode 61 and the second electrode 63 may be reversed.

The first electrode 61 may be formed of a transparent electrode or a reflective electrode. Such a transparent electrode may be formed of, for example, indium tin oxide (ITO), indium zinc oxide (IZO), zinc oxide (ZnO), or indium oxide ($In_2O_3$). Such a reflective electrode may be formed by forming a reflective layer from, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof, and forming a layer of ITO, IZO, ZnO, or $In_2O_3$ on the reflective layer.

The second electrode 63 may also be formed as a transparent electrode or a reflective electrode. When the second electrode 63 is formed as a transparent electrode, the second electrode 63 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof, on a surface of the organic layer 62 and forming an auxiliary electrode layer or a bus electrode line thereon from ITO, IZO, ZnO, $In_2O_3$, or the like. When the second electrode 63 is formed as a reflective electrode, the reflective layer may be formed by depositing Li, Ca, LiF/Ca, LiF/Al, Al, Ag, Mg, or a compound thereof on the entire surface of the organic layer 62.

Meanwhile, a common power supply line 64 may be formed in the non-display area NDA, in particular, in an area where the non-display area NDA overlaps a cathode area CA. The common power supply line 64 may be electrically connected to the second electrode 63. In detail, the common power supply line 64 may be formed of the same material as that of the gate electrode 54 on the same plane as the gate electrode 54 when the gate electrode 54 is formed. A contact hole CTH may be formed in the pixel-defining layer 60, the planarization layer 59, the passivation layer 58, and the insulating interlayer 55 so as to expose at least a part of the common power supply line 64. The second electrode 63 may be formed on the common power supply line 64, so that the common power supply line 64 and the second electrode 63 may contact each other and may be electrically connected to each other. Thus, the common power supply line 64 may supply power to the second electrode 63.

In FIG. 3, the common power supply line 64 and the gate electrode 54 may be formed of the same material on the same plane, but the embodiments are not limited thereto. That is, when the source/drain electrodes 56 and 57 are formed, the common power supply line 64 may be formed of the same material and on the same plane as the source/drain electrodes 56 and 57.

Hereinafter, the pixel-defining layer 60 of the organic light-emitting display device according to the current embodiment will be described.

In a conventional organic light-emitting display device, an organic layer including an emission layer deteriorates due to residual gas in a planarization layer formed of an organic material, thereby causing a pixel shrinkage phenomenon. In order to solve such a problem, there have been attempts to discharge residual gas in the planarization layer to the outside, that is, to perform outgassing by forming an outgassing hole in the pixel-defining layer. In such a conventional organic light-emitting display device, the outgassing holes for performing outgassing are formed on the pixel-defining layer, but the outgassing holes are also formed below the organic layer and a second electrode. Thus, the conventional organic light-emitting display device still has a problem in that the organic layer including an emission layer deteriorates due to residual gas in the planarization layer, thereby causing a pixel shrinkage phenomenon.

In other words, conventionally, the outgassing holes for performing outgassing of residual gas in the planarization layer are formed inside the organic layer and the second electrode. As such, the residual gas resulting from heat generated during a manufacturing process of a TFT could be discharged. However, since the outgassing holes are covered by the organic layer and the second electrode after performing deposition of the organic layer, detachment of a thin film and a pixel shrinkage phenomenon continuously occur due to residual gas resulting from heat generated after performing deposition of the organic layer.

In order to solve such a problem, in the organic light-emitting display device 1 according to the current embodiment, the outgassing holes may be formed only in the pixel-defining layer 60 in an area where the second electrode 63 is not formed. Effective outgassing may, thereby, be facilitated and reliability of a product may be improved by preventing a pixel shrinkage phenomenon from occurring, which will be described later in detail.

As described above, the first substrate 50 may include the display area DA, where light is emitted, and the non-display area NDA located outside of the display area DA. The second electrode 63 may be formed to cover the entire display area DA. The area where the second electrode 63 is formed may form a cathode area CA. The cathode area CA may include the display area DA and a part of an area outside the display area DA. The pixel-defining layer 60 may be formed in the cathode area CA and in an area outside the cathode area CA. The area in which the pixel-defining layer 60 is formed may form a pixel-defining layer area PA.

In this regard, outgassing holes 60a, 60b, and 60c may be formed in the pixel-defining layer 60 in an area where the second electrode 63 is not formed. In other words, the outgassing holes 60a, 60b, and 60c may be formed in an area of the pixel-defining layer that is not covered by the second electrode 63, e.g., an exposed portion of the pixel-defining layer. Thus, the area of the outgassing holes 60a, 60b, and 60c may be formed in a portion of the pixel-defining layer that is different from a portion of the pixel-defining layer covered by the second electrode 63. Alternatively, the second electrode 63 and the outgassing holes 60a, 60b, and 60c may be formed to overlap with each other.

Figure 4:
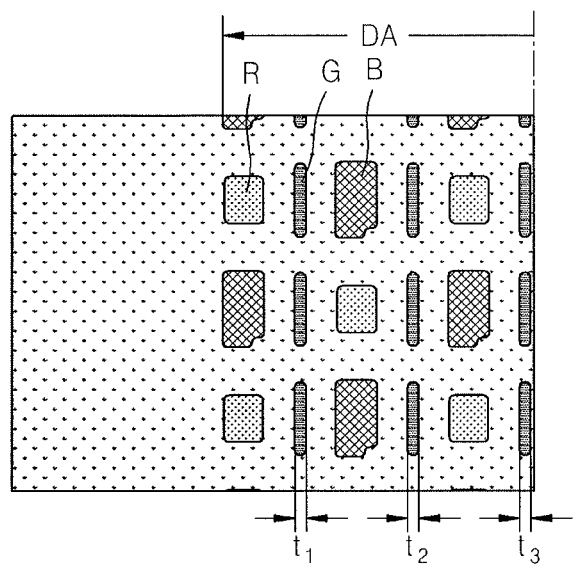
FIG. 4 a view of an organic light-emitting display device when outgassing holes are formed in an area where a second electrode is not formed as illustrated in FIGS. 1 through 3, according to an embodiment.
Figure 5:
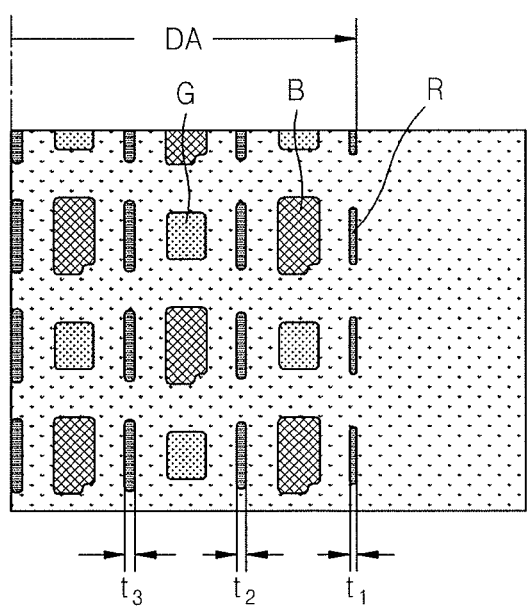
FIG. 5 illustrates a view of an organic light-emitting display device when outgassing holes are formed to overlap with a second electrode as in a conventional organic light-emitting display device.

FIG. 4 illustrates a view of an organic light-emitting display device in which outgassing holes are formed in an area where a second electrode is not formed as illustrated in FIGS. 1 through 3, according to an embodiment. FIG. 5 illustrates a view of an organic light-emitting display device when outgassing holes are formed to overlap with a second electrode as in a conventional organic light-emitting display device.

As illustrated in FIG. 4, when the outgassing holes are formed in the area where the second electrode is not formed, widths of organic layers may be uniformly formed even at an end portion of a display area DA, i.e., the leftmost side of the display area DA of FIG. 4. In other words, a width t1 of a green organic layer formed at the outermost portion of the display area DA may be equal to widths t2 and t3 of green organic layers internally formed (t1=t2=t3). The outgassing holes may be formed outside of the organic layer 62 and the second electrode 63 so as to prevent a pixel shrinkage phenomenon from occurring, thereby maintaining pixel uniformity.

On the contrary, as illustrated in FIG. 5, when the outgassing holes are formed to overlap with the second electrode, a pixel shrinkage phenomenon occurs, in which a width of an organic layer decreases toward an end portion of a display area DA, i.e., rightmost side of the display area in FIG. 5. In other words, a width t1 of a green organic layer formed at an outermost portion of the display area DA, a width t2 of a green organic layer, and a width t3 of a green organic layer formed at the innermost portion of the display area DA, sequentially decrease (t1<t2<t3). Accordingly, a pixel shrinkage phenomenon occurs, in which a width of an organic layer decreases toward an end portion of the display area DA, due to outgassing generated from a planarization layer. Thus, detachment of a thin film and the pixel shrinkage phenomenon continuously occur.

The outgassing holes may be formed outside of the organic layer 62 and the second electrode 63, and may not be formed below the organic layer 62 and the second electrode 63. According to various embodiments, effective outgassing may be facilitated by preventing detachment of the organic layer during a heat treatment process performed after performing deposition of the organic layer. According to various embodiments, reliability of a product may be improved by preventing a pixel shrinkage phenomenon from occurring.

One or more embodiments may provide an organic light-emitting display device that improves reliability of a product by facilitating effective outgassing and preventing a pixel shrinkage phenomenon from occurring.

While the embodiments have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device comprising:
    a substrate;
    a plurality of thin film transistors (TFTs) on the substrate;
    a plurality of first electrodes respectively on the TFTs;
    a pixel-defining layer between the first electrodes, the pixel-defining layer including a covered portion and an uncovered portion;
    a plurality of organic layers respectively on the first electrodes, each organic layer including an emission layer;
    a second electrode covering at least a part of the organic layers and the pixel-defining layer, a portion of the pixel-defining layer covered by the second electrode defining the covered portion,
    wherein at least one outgassing hole is in the uncovered portion of the pixel-defining layer, the uncovered portion being an exposed area of the pixel-defining layer.

2. The organic light-emitting display device of claim 1, wherein a plurality of outgassing holes are in the uncovered portion of the pixel-defining layer.

3. The organic light-emitting display device of claim 1, wherein the covered portion covered by the second electrode is different from the uncovered portion in which the at least one outgassing hole is defined.

4. The organic light-emitting display device of claim 1, further comprising:
    a planarization layer between the TFTs and the pixel-defining layer, the planarization layer covering the TFTs,
    wherein the at least one outgassing hole exposes at least a part of the planarization layer.

5. The organic light-emitting display device of claim 1, wherein the covered portion of the pixel-defining layer and the uncovered portion of the pixel-defining layer consist of different portions of the pixel-defining layer.

6. An organic light-emitting display device, comprising:
at least one thin film transistor (TFT) on a substrate, the TFT including an active layer, a gate electrode insulated from the active layer, and source and drain electrodes contacting opposing sides of a semiconductor active layer;
a planarization layer on the at least one TFT and covering the at least one TFT;
at least one first electrode on the planarization layer and electrically connected to the at least one TFT;
at least one organic layer formed on the at least one first electrode, the at least one organic layer including an emission layer;
a second electrode facing the at least one first electrode; and
a pixel-defining layer covering an edge portion of the at least one first electrode;
wherein an outgassing hole is in an edge area of the pixel-defining layer and exposes at least a part of the planarization layer.

7. The organic light-emitting display device of claim 6, wherein the outgassing hole is in the pixel-defining layer in an area where the second electrode is not formed.

8. The organic light-emitting display device of claim 7, wherein the outgassing hole is formed in an upper portion of the pixel-defining layer.

9. The organic light-emitting display device of claim 6, wherein the second electrode is on a portion of the pixel-defining layer that is different from a portion of the pixel-defining layer in which the outgassing hole is defined.

10. The organic light-emitting display device of claim 6, further including a common power supply line, the common power supply line including a material that is the same as a material included in the gate electrode and is on a same plane as the gate electrode.

11. The organic light-emitting display device of claim 6, further including a common power supply line, the common power supply line including a material that is the same as a material included in the source and drain electrodes on the substrate.

12. The organic light-emitting display device of claim 6, wherein ends of the second electrode are spaced from an edge area of the pixel-defining layer.

13. An organic light-emitting display device, comprising:
a substrate;
a display area including a plurality of TFTs on the substrate, a plurality of first electrodes electrically connected to the TFTS, and a plurality of organic layers on the first electrodes, each of the plurality of organic layers including an emission layer;
a cathode area including the display area and a second electrode facing the first electrode; and
a pixel-defining layer covering at least a part of the first electrode and including at least one outgassing hole, the pixel-defining layer having an area that is outside the cathode area and another area that includes the cathode area, the at least one outgassing hole being in the area of the pixel-defining layer that is outside the cathode area.

14. The organic light-emitting display device of claim 13, wherein the at least one outgassing hole is in a portion of the pixel-defining layer that is different from a portion of the pixel-defining layer covered by the second electrode.

15. The organic light-emitting display device of claim 13, wherein the area of the pixel-defining layer including the cathode area is different from the area of the pixel-defining layer including the at least one outgassing hole.

* * * * *